United States Patent [19]
Fukazawa et al.

[11] Patent Number: 5,705,941
[45] Date of Patent: Jan. 6, 1998

[54] OUTPUT DRIVER FOR USE IN SEMICONDUCTOR INTEGRATED CIRCUIT

[75] Inventors: Hidetaka Fukazawa, Kurokawa-gun; Satoshi Sekine, Sendai, both of Japan

[73] Assignee: Motorola, Inc., Schaumburg, Ill.

[21] Appl. No.: 452,465

[22] Filed: May 26, 1995

[30] Foreign Application Priority Data

Jun. 7, 1994 [JP] Japan .................................. 6-125254

[51] Int. Cl.$^6$ .................................................. H03K 19/0185
[52] U.S. Cl. .................................. 326/86; 326/30; 327/314
[58] Field of Search .................................. 326/83, 86–87, 326/121, 80–81, 9, 15, 23–24, 30; 361/91, 56; 327/310, 314

[56] References Cited

U.S. PATENT DOCUMENTS

| | | | |
|---|---|---|---|
| 5,036,224 | 7/1991 | Wendell | 326/66 |
| 5,075,577 | 12/1991 | Okitaka | 326/86 |
| 5,218,232 | 6/1993 | Yuzurihara et al. | 257/412 |
| 5,239,440 | 8/1993 | Merrill | 361/91 |
| 5,335,134 | 8/1994 | Stein et al. | 361/91 |

*Primary Examiner*—Edward P. Westin
*Assistant Examiner*—Jon Santamauro
*Attorney, Agent, or Firm*—Harry A. Wolin; Rennie William Dover

[57] ABSTRACT

An output driver that allows for static protection during generation of static discharge. The output driver includes a static protection circuit located between a predrive stage and a power drive stage.

17 Claims, 4 Drawing Sheets

OUTPUT DRIVER FOR USE IN SEMICONDUCTOR INTEGRATED CIRCUIT

TECHNICAL FIELD

The present invention relates to an output driver for a semiconductor integrated circuit (IC) device.

BACKGROUND

FIG. 1 shows an internal structure of an integrated circuit package as the semiconductor IC device.

In the figure, a plurality of lead pins 2 are provided in an IC package 1 for signal connection with an external device, and a silicon chip 3 made of a silicon semiconductor is affixed thereto. On the silicon chip 3 are disposed a circuit component 30 on which multiple IC elements are formed for controlling circuit operation as an IC package, and also a plurality of input and output (I/O) buffers 31. Also on this silicon chip 3 are formed a Vdd bus 34 as a high-potential power supply line and a Vss bus 35 as a low-potential power supply line, such that they surround these I/O buffers 31 in a circular fashion. The lead pin 2 and input/output buffer 31 are connected together with a bonding wire 4 and a bonding pad 32. The input/output buffer 31 converts an external signal supplied from an external device via the bonding wire 4 and bonding pad 32 into a desired voltage, which is in turn supplied to the circuit component 30. The input/output buffer 31 also converts the signal supplied from the circuit component 30 into a desired voltage, which is in turn outputted via the bonding pad 32, bonding wire 4 and the lead pin 2 to the external device.

With an IC package so configured, it is known that static electricity charged on a human body, for instance, may discharge and a high-voltage current induced by this static discharge flows into the silicon chip 3 via the lead pin 2. Then, such a high-voltage current may be conducted through the lead pin 2 and bonding pad 32 into the output driver which is directly connected to the bonding pad 32, thereby destroying it.

To prevent the static electricity-induced destruction of the output driver, an arrangement is employed where a static protection circuit is provided near the bonding pad 32.

FIG. 2 shows one example of an internal structure of the input/output buffer 31, that incorporates such a static protection circuit and an output driver. It should be noted that a prime (') has been added to reference numeral 31 to distinguish a first embodiment of the input/output buffer from other embodiments.

It should be noted in FIG. 2 that only the output stage configuration of the input/output buffer function is shown, and its input stage configuration is not shown.

In FIG. 2, a signal supplied from the circuit component 30 is provided to an output driver 40 comprised of a predriver 41 and a power MOS (Metal Oxide Semiconductor) transistor 42. The predriver 41 converts the signal supplied from the circuit component 30 into a desired voltage that is capable of driving the power MOS transistor 42, and applies it as a power-drive-stage drive signal to a drive signal line P. This power-drive-stage drive signal is supplied via the drive signal line P to a gate terminal, G, of the power MOS transistor 42. To a drain terminal, D, of the power MOS transistor 42 is connected a bonding pad 32, while its source terminal, S, is connected to a Vss bus 35 that acts as a low-potential power supply line. In other words, the output driver 40 is an output driver of open-drain type comprised of the predriver 41 as its predrive stage and the power MOS transistor 42 as its power drive stage, and is configured so that its output end is connected to the bonding pad 32.

Near the bonding pad 32 is formed a static protection circuit comprised of MOS transistors 37 and 38. The MOS transistor 37 is of P-channel type, having its gate terminal G, source terminal S and back-gate connected, to the Vdd bus 34 that acts as a high-potential power supply line. The drain terminal D of the MOS transistor 37 is connected to the bonding pad 32 and the drain terminal D of the MOS transistor 38. The MOS transistor 38 is of N-channel type, having its gate terminal G, source terminal S and back-gate connected, to the Vss bus 35 that acts as a low-potential power supply line. In FIG. 2, the MOS transistors 37 and 38 are shown as functioning to provide static protection, though such a static protection may be generally substituted by a parasitic portion of the power MOS transistor 42 itself that acts as the output stage.

The operation of the static protection circuit is now described.

In FIG. 2, when a positive high voltage is applied to the lead pin 2 (FIG. 1) due to static discharge, the parasitic diode of the MOS transistor 37 is turned on, causing most of the current induced by the high voltage applied thereto to flow into the Vss bus 34 through the bonding pad 32 and MOS transistor 37. Because of the diode operation of the MOS transistor 37, most of the current induced by applying such a positive high voltage is sunk via the MOS transistor 37 into the Vdd bus 34 and absorbed there. Thus, the current flowing into the power MOS transistor 42 is significantly reduced, thereby preventing destruction of the circuit elements. On the other hand, when a negative high voltage is applied to the lead pin 2, most of the current induced by such a high voltage applied thereto flows into the Vss bus 35 through the bonding pad 32 and MOS transistor 38, owing to the diode operation of the MOS transistor 38. Thus, the current flowing into the power MOS transistor is significantly reduced in a similar manner, thus preventing destruction of the circuit elements.

However, a parasitic capacitance exists between the drain terminal D and gate terminal G of the power MOS transistor 42. Such parasitic capacitance between the drain and gate is present not only for the above-mentioned power MOS transistor, but also for typical MOS transistors; for a circuit with significant output such as a power MOS transistor, its parasitic capacitance is also significant, which results in a correspondingly significant coupling effect.

Consequently, when a high voltage is applied to the drain terminal D of the power MOS transistor 42 in response to the generation of static discharge, the potential on the floating gate terminal G rises (or falls) due to capacitance coupling between the drain terminal D and gate terminal G of the power MOS transistor 42, even when the static protective function of the Mos transistors 37 and 38 works, and as such the resulting current flows into the predriver 41.

Thus, with the above-described configuration, although static protection for the power MOS transistor is provided, the predriver 41 may be damaged when an instantaneous high voltage flows into the predriver 41 due to parasitic capacitance of the power MOS transistor 42.

The present invention has its objective to provide an output driver that is capable of static protection.

SUMMARY OF THE INVENTION

According to the present invention, the output driver for a semiconductor integrated circuit device is provided, comprising: a predriver stage for converting an input signal into a desired voltage to generate a power-drive-stage drive signal and applying it to a drive signal line; and a power drive stage for applying to a bonding pad an output signal corresponding to said power-drive-stage drive signal, said output driver including a static protection circuit, which, when a high voltage greater than a predetermined voltage value is applied to said drive signal line, connects said drive signal line and a power-supply bus line to forcefully conduct the current induced by said high voltage applied thereto into said power-supply bus line.

A static protection circuit is provided between the pre-driver stage for converting an input signal into a desired voltage to generate a power-drive-stage drive signal and applying it to a drive signal line and a power drive stage for providing an output signal corresponding to the power-drive-stage drive signal, said static protection circuit, which, when a high voltage greater than a predetermined voltage value is applied to said drive signal line, connects this drive signal line and a power supply bus line to forcefully conduct the current induced by the high voltage applied thereto into the power-supply bus line.

DETAILED DESCRIPTION OF THE PREFERRED EMBODIMENT

Figure 1:
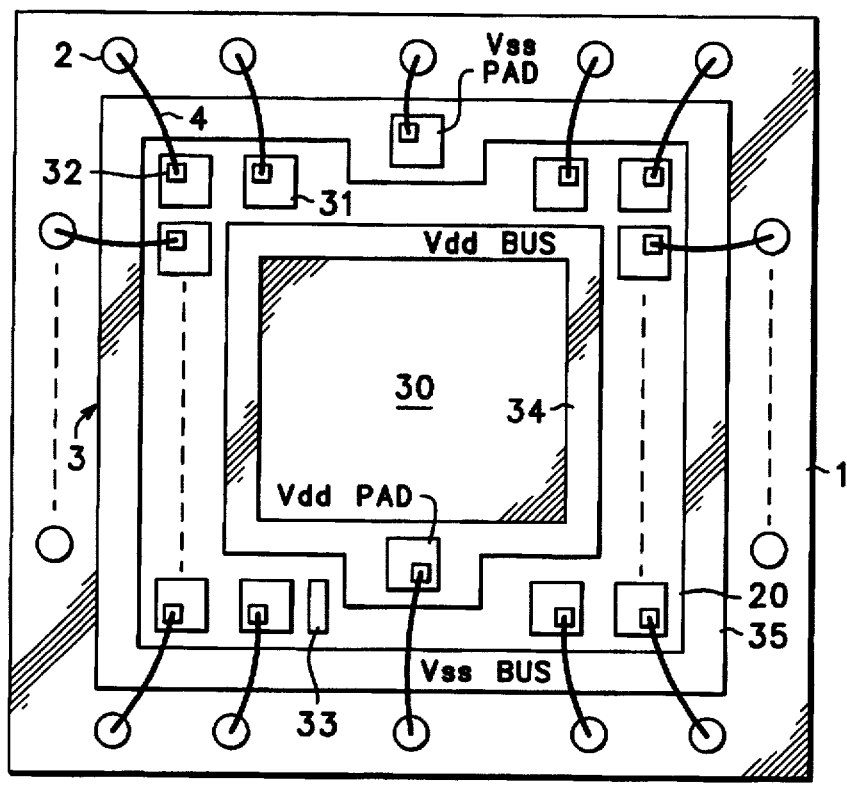
FIG. 1 shows an internal structure of an integrated circuit package.
Figure 2:
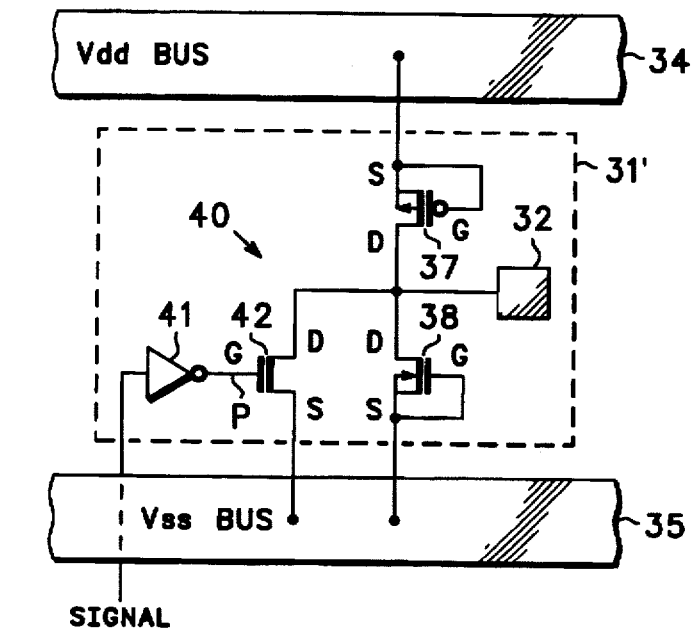
FIG. 2 shows an internal structure of an input/output buffer 31'.
Figure 3:
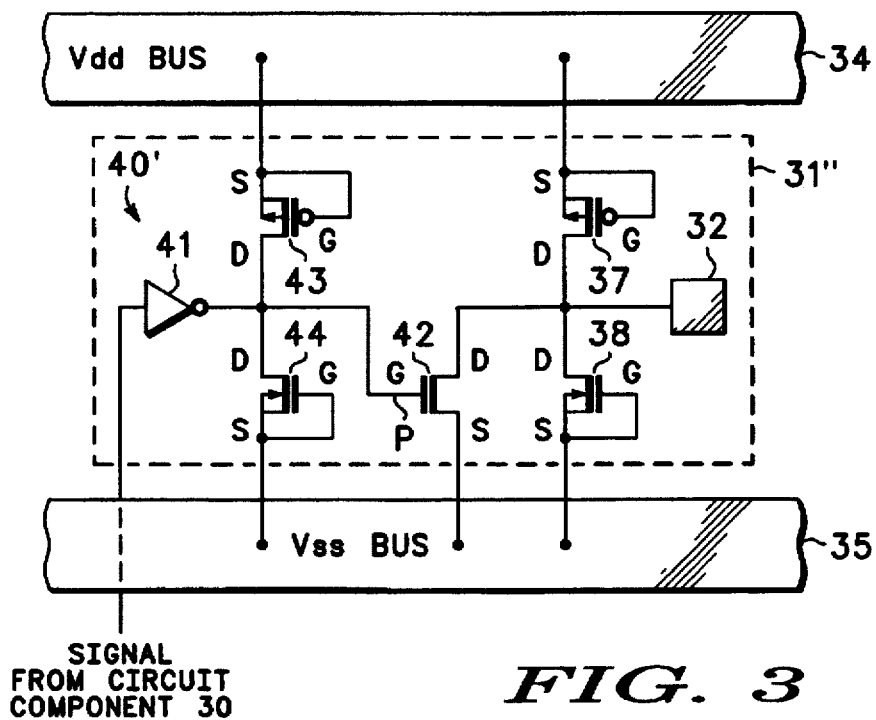
FIG. 3 shows an internal structure of an input/output buffer 31" having an output driver 40' according to the present invention.

FIG. 3 shows one example of an input/output buffer 31" having an output driver 40' according to the present invention. It should be noted that a prime (') has been added to reference numeral 31 to distinguish a second embodiment of the input/output buffer from other embodiments.

In the figure, a signal supplied from a circuit component 30 is provided to the output driver 40' comprised of a predriver 41, a power MOS (Metal Oxide Semiconductor) transistor 42, and MOS transistors 43 and 44.

The predriver 41 converts a signal supplied from the circuit component 30 into a desired voltage that is capable of driving the power MOS transistor 42, and applies it as a power-drive-stage drive signal to the drive signal line P. The resulting power-drive-stage drive signal is supplied to the gate terminal G of the power MOS transistor 42 via the drive signal line P. To the drain terminal D of the power MOS transistor 42 is connected a bonding pad 32, while its source terminal S is connected to a Vss bus 35 that acts as a low-potential power supply line.

Furthermore, to the drive signal line P are connected the drain terminals D of the MOS transistors 43 and 44 that act as a static protection circuit. The MOS transistor 43 is of P channel type, having its gate terminal G, source terminal S and back-gate connected, respectively, to a Vdd bus 34 that acts as a high-potential power supply line. The MOS transistor 44 is of N channel type, having its gate terminal G, source terminal S and back-gate connected, respectively, to the Vss bus 35 that acts as a low-potential power supply line. The circuit comprised of these MOS transistors 43 and 44 is a so-called disable buffer whose output is always fixed in a high-impedance state.

Near the bonding pad 32 is formed a static protection circuit comprised of MOS transistors 37 and 38. The MOS transistor 37 is of P channel type, having its gate terminal G, source terminal S and back-gate connected, to the Vdd bus 34 that acts as a high-potential power supply line. The drain terminal D of the MOS transistor 37 is connected to the bonding pad 32 and the drain terminal D of the MOS transistor 38. The MOS transistor 38 is of N channel type, having its gate terminal G, source terminal S, and back-gate connected, respectively, to the Vss bus 35 that acts as a low-potential power supply line.

With the output driver 40' so configured according to the present invention, the static protection circuit comprised of the MOS transistors 37 and 38 is provided on the drive signal line that connects the predriver 41 that acts as a predrive stage and the power MOS transistor 42 that acts as a power drive stage.

The operation of this configuration is now described.

When a high voltage greater than a predetermined voltage value is applied to the bonding pad 32 due to the generation of static discharge and, as a result, a positive high voltage is instantaneously applied to the drive signal line P due to parasitic capacitance of the power MOS transistor 42, most of the current induced by such a positive high voltage applied thereto is sunk into the Vdd bus 34 through the MOS transistor 43 and absorbed there, due to the diode operation of the MOS transistor 43.

Alternatively, the parasitic diode of the MOS transistor 44 is turned on, and most of the current induced by applying such a positive high voltage is sunk into the Vss bus 35 and absorbed there. On the other hand, when a negative high voltage is applied to the drive signal line P, most of the current induced by such a negative high voltage applied thereto is sunk into the Vss bus 35 and absorbed there, due to the diode operation of the MOS transistor 44. Alternatively, most of the current induced by such a negative high voltage applied is sunk into the Vdd bus 34 and absorbed there, due to the diode operation of the MOS transistor 43.

Thus, the current flowing into the predriver 41 is significantly reduced, thereby preventing destruction of circuit elements.

More specifically, when a high voltage greater than a predetermined voltage value is applied to the drive signal line P, the MOS transistors 43 and 44 that act as a disable buffer connecting this drive signal line P and the Vdd bus 34 (or Vss bus 35) to forcefully conduct the current induced by that high voltage applied into the Vdd bus 34 (or Vss bus 35), thereby providing static protection for the predriver 41.

In the above embodiment, although a disable buffer comprised of the MOS transistors 43 and 44 is used as a static protection circuit, it should be appreciated that it is not limited to such a configuration as a disable buffer. That is, any buffer whose output is always fixed in a high-impedance state may be used.

Figure 4:
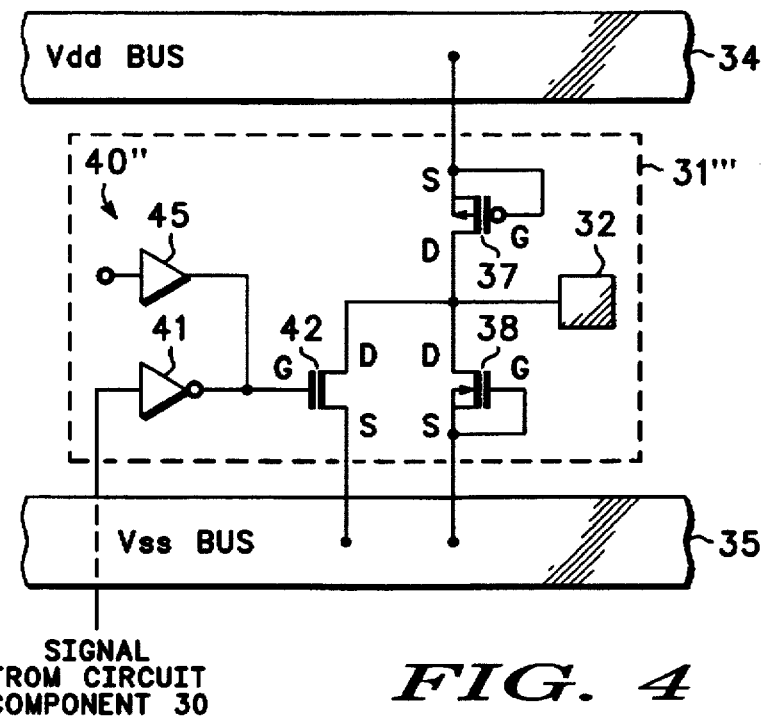
FIG. 4 shows an internal structure of an input/output buffer 31'" having an output driver 40" according to another embodiment of the present invention.

Additionally, in the above embodiment, although such a disable buffer is shown as connected between the predrive stage and power drive stage, a similar effect may be obtained by connecting a disable buffer 45 in parallel with the predriver 41 that acts as a predriver stage, as shown in FIG. 4. It should be noted that primes (') have been added to reference numerals 31 and 40 to distinguish a third embodiment of the input/output buffer from other embodiments.

Furthermore, in the above embodiment, the MOS transistors 37 and 43 are of P-channel type; however, they may be configured as an N-channel type to allow for similar static protective operation.

Figure 5:
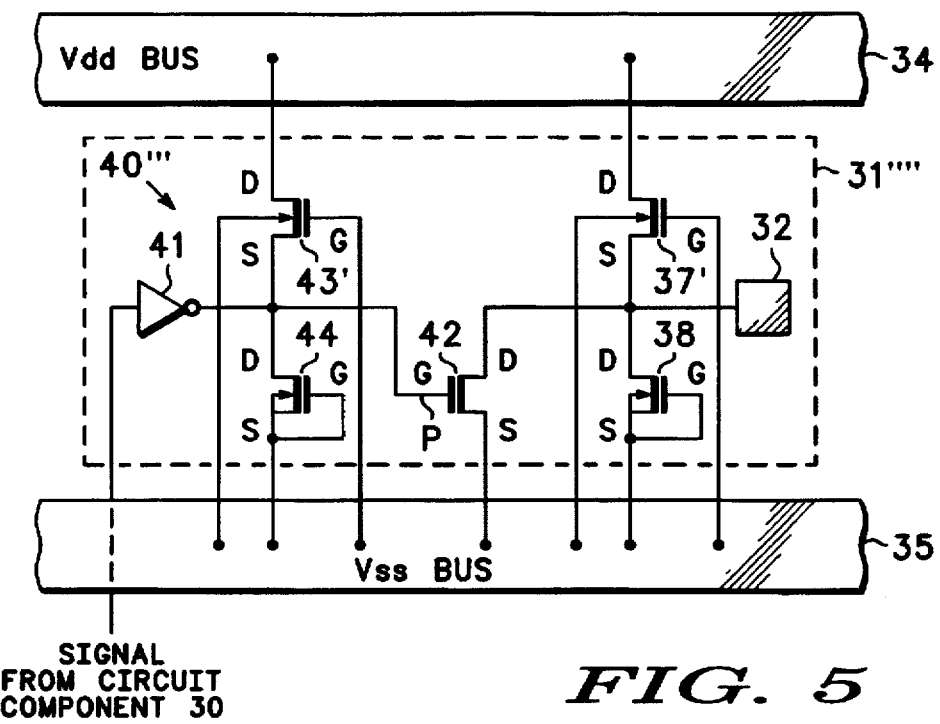
FIG. 5 shows an internal structure of an input/output buffer 31"" having an output driver 40'" according to still another embodiment of the present invention.

FIG. 5 shows one example of an input/output buffer 31"" where the MOS transistors 37 and 43 are configured as MOS transistors 37' and 43' of N-channel type. It should be noted that primes (') have been added to reference numerals 31 and 40 to distinguish a fourth embodiment of the input/output buffer from other embodiments.

In FIG. 5, the same functional elements shown in FIG. 3 are similarly numbered.

As shown, in FIG. 5, the MOS transistor 37' of N-channel type has its drain terminal D connected to a Vdd bus 34 that acts as a high-potential power supply line, while its gate terminal G and back-gate are connected to a Vss bus 35 that acts as a low-potential power supply line. Furthermore, the source terminal S of the MOS transistor 37' is connected to a drain terminal D of the MOS transistor 38. On the other hand, the MOS transistor 43' of N-channel type has its drain terminal D connected to the Vdd bus 34 that acts as a high-potential power supply line, while its gate terminal G and back-gate are connected to the Vss bus 35 that acts as a low-potential power supply line. Furthermore, the source terminal S of the MOS transistor 43' is connected to a drain terminal D of the MOS transistor 44.

So configured as shown in FIG. 5, when a voltage applied to the drive signal line P and bonding pad 32 is greater than the power supply voltage applied between the Vdd bus 34 and Vss bus 35, that is, when the output driver 40'" outputs via the bonding pad 32 to an external device a signal of a higher voltage value than the power supply voltage used in the circuit component 30, a normal driver operation is ensured.

It should be noted that in the above embodiment, the output driver 40'" is formed in the input/output buffer 31"", though the output driver 40'" may be formed in the circuit component 30.

Furthermore, in the above embodiment, a static protection circuit is provided between the predriver 41 and power MOS transistor 42 in order to prevent destruction of the predriver 41 during static discharge, although a layout may be devised such that the predriver 41 itself is capable of static protection without providing such a static protection circuit.

Figure 6:
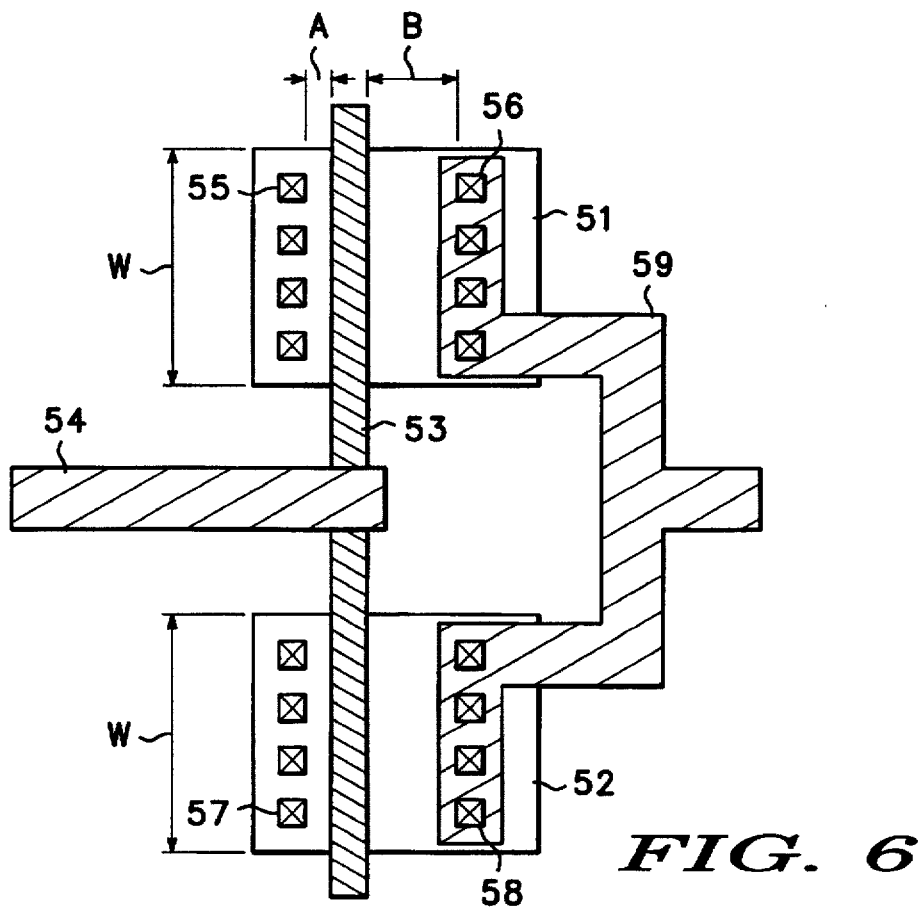
FIG. 6 shows a layout of a final output stage of a predriver 41 according to the present invention.

FIG. 6 shows one example of a layout of a final output stage of a predriver 41 having such a static protective function.

In FIG. 6, a polysilicon gate wire 53 is deposited via an oxide layer (not shown) on a P-channel diffusion area 51 and an N-channel diffusion area 52. To that polysilicon gate wire 53 is connected a metal wire 54 that acts as a gate electrode. A source contact hole 55 is formed a distance, A, away from an end face of the polysilicon gate wire 53 within the P-channel diffusion area 51. Also, a drain contact hole 56 is formed a distance, B, away from an end face opposite to that end face of the polysilicon gate wire 53. On the other hand, a source contact hole 57 is formed a distance, A, away from the end face of the polysilicon gate wire 53 within the N-channel diffusion area 52, while a drain contact hole 58 is formed a distance, B, away from the end face opposite thereto. The drain contact hole 56 formed in the P-channel diffusion area 51 and the drain contact hole 58 formed in the N-channel diffusion area 52 are connected by a metal wire 59. With such a configuration, a power-drive-stage drive signal as an output signal of the predriver 41 is supplied to the gate terminal G of the power MOS transistor 42 via the metal wire 59. That is, the metal wire 59 acts as a drive signal line P.

It should be noted that the above-mentioned distance A is a minimum gate-to-contact distance specified by a layout design rule for an integrated circuit device itself, while the above-mentioned distance B is a predetermined distance greater than the distance A.

In other words, the contact holes 56 and 58 connected to the gate terminal G of the power MOS transistor 42 via the metal wire 59 are formed away from the end face of the polysilicon gate wire 53 over a distance greater than the minimum gate-to-contact distance A therefrom.

By configuring the final output stage of the predriver 41 in such a layout, static protection for the predriver 41 can be achieved without providing a static protection circuit comprised of MOS transistors 43 (or 43') and 44.

Optionally, a similar effect can be attained by increasing the gate width, W, of the polysilicon gate wire 53 shown in FIG. 6. Alternatively, a similar effect can be accomplished with a layout where a disabling polysilicon gate wire 53' is added, without increasing the gate width W of the predriver.

Figure 7:
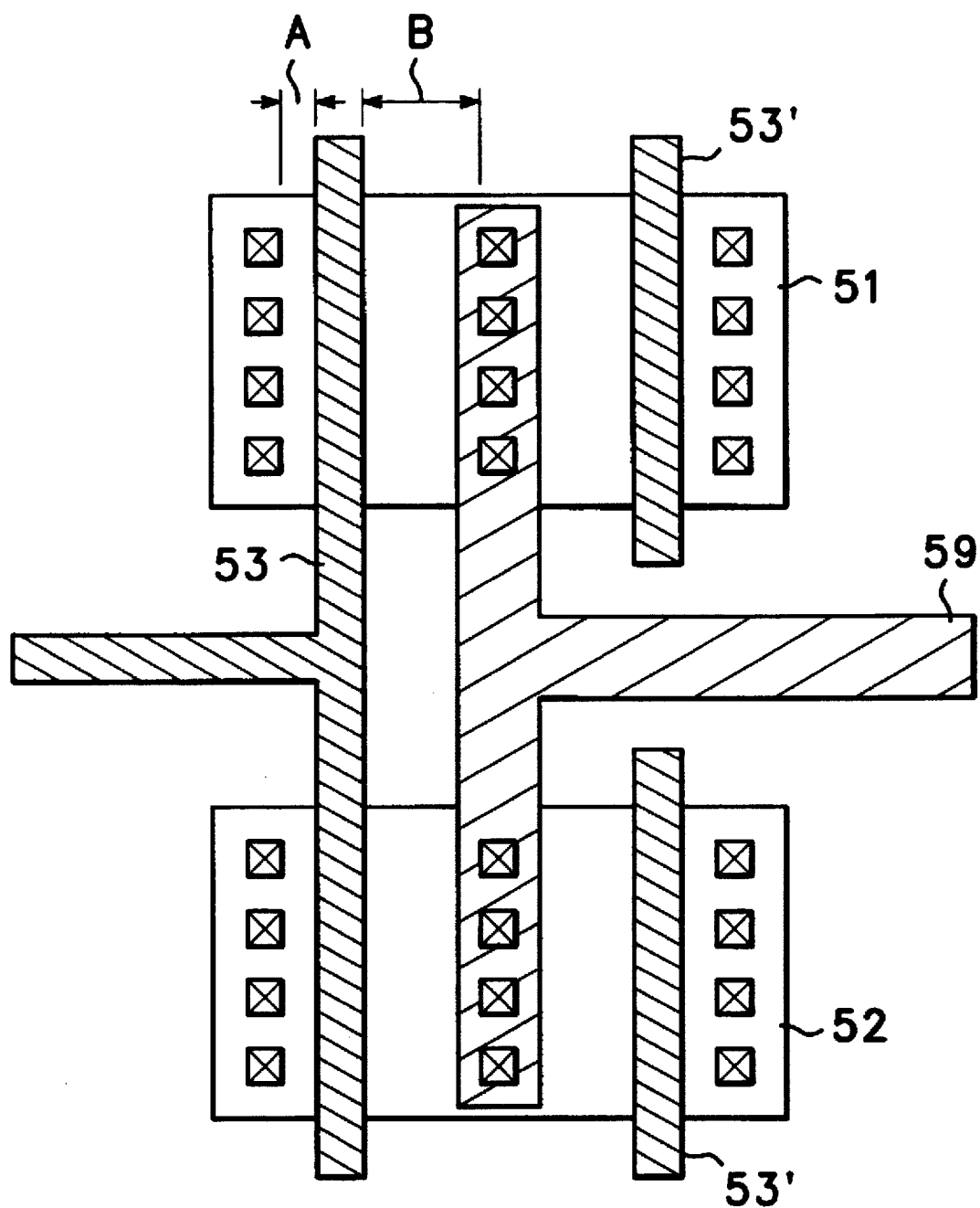
FIG. 7 shows a layout of an final output stage of a predriver 41 according to another embodiment of the present invention.

FIG. 7 shows one example of a predriver layout where such a disabling polysilicon gate wire 53' is added. Note that the same elements as in FIG. 6 are similarly numbered.

As is clear from the above, the output driver according to the present invention is so configured that a static protection circuit is provided between a predriver stage for generating a power-drive-stage drive signal and applying it to a drive signal line and a power drive stage for providing an output signal corresponding to that power-drive-stage drive signal, said static protection circuit which, when a high voltage greater than a predetermined voltage value is applied to the drive signal line, connects this drive signal line and a power-supply bus line to forcefully conduct the current induced by that high voltage applied thereto into the power supply bus line.

Accordingly, even if an instantaneous high voltage is applied to the predrive stage due to parasitic capacitance of the power MOS transistor of the power drive stage, it can be absorbed, thereby advantageously allowing for reliable protection against the destruction of the output driver.

We claim:

1. An output driver for a semiconductor integrated circuit device, comprising:

a predriver stage for converting an input signal into a desired voltage to generate a power-drive-stage drive signal and applying it to a drive signal line; and a power drive stage for applying to a bonding pad an output signal corresponding to said power-drive-stage drive signal, said output driver including:

when a high voltage greater than a predetermined voltage value is applied to said drive signal line, a static protection circuit for connecting said drive signal line and a power-supply bus line to forcefully conduct the current induced by said high voltage applied thereto into said power-supply bus line.

2. An output driver for a semiconductor integrated circuit device according to claim 1, wherein said static protection circuit comprises a P-channel MOS transistor having its source and drain terminals connected to a high-potential power supply line and said drive signal line, respectively, and an N-channel MOS transistor having its drain and source terminals connected to said drive signal line and a low-potential power supply line, respectively.

3. An output driver for a semiconductor integrated circuit device according to claim 1, wherein said static protection circuit comprises an N-channel MOS transistor having its drain and source terminals connected to a high-potential power supply line and said drive signal line, respectively, and an N-channel MOS transistor having its drain and source terminals connected to said drive signal line and a low-potential power supply line.

4. An output driver for a semiconductor integrated circuit device according to claim 1, wherein said static protection circuit comprises a disable buffer whose output is always coupled to a high-impedance node.

5. An output driver for a semiconductor integrated circuit device according to claim 1, wherein said disable buffer is connected between an output of said predriver stage and the drive signal line.

6. An output driver for a semiconductor integrated circuit device, comprising:

a predriver stage for converting an input signal into a desired voltage to generate a power-drive-stage drive signal and applying it to a drive signal line; and a power drive stage for applying to a bonding pad an output signal corresponding to said power-drive-stage drive signal, wherein a last-stage MOS transistor in said predriver stage comprises a metal wire connected to said drive signal line, a diffusion area on which a polysilicon gate wire is disposed, and a contact hole for connecting said metal wire and said diffusion area, and wherein said contact hole is formed away from an end face of said polysilicon gate wire over a distance greater than a minimum gate-to-contact hole distance specified by a layout design rule for said semiconductor integrated circuit device.

7. An output driver capable of providing electrostatic discharge protection, comprising:

a predrive circuit having an input terminal and an output terminal;

a first protection circuit having first and second bias terminals and a drive node, wherein the output terminal of the predrive circuit is coupled to the drive node;

a drive stage having an input terminal and an output terminal, wherein the input terminal is coupled to the drive node; and a second protection circuit having first and second bias terminals and a coupling node, wherein the output terminal of the drive stage is coupled to the coupling node.

8. The output driver of claim 7, wherein the drive stage comprises a transistor having a control electrode, a first current carrying electrode, and a second current carrying electrode, wherein the control electrode serves as the input terminal of the drive stage and the first current carrying electrode serves as the output terminal of the drive stage.

9. The output driver of claim 7, wherein the second current carrying electrodes of the first diode and the second diode are coupled a first bus and the first current carrying electrodes of the first diode and the second diode are coupled a second bus.

10. The output driver of claim 7, wherein the predrive circuit comprises an inverter circuit.

11. The output driver of claim 7, wherein:

the first diode is a P-channel field effect transistor having a gate electrode, a back-gate electrode, and first and second current carrying electrodes; and the second diode an N-channel field effect transistor having a gate electrode, a back-gate electrode, and first and second current carrying electrodes, wherein the first current carrying electrode of the second diode is coupled to the first current carrying electrode of the first diode, and the second current carrying electrode, the gate electrode and the back-gate electrode of the second diode are commonly coupled.

12. The output driver of claim 11, wherein the back-gate electrode of the first diode is commonly coupled to second current carrying electrode and to the control electrode of the first diode.

13. The output driver of claim 11, wherein the second protection circuit comprises:

a third diode having an anode and a cathode; and a fourth diode having an anode and a cathode, the anodes of the first and second diodes commonly coupled.

14. The output driver of claim 13, wherein:

the third diode is a P-channel field effect transistor having a gate electrode, a back-gate electrode, and first and second current carrying electrodes; and the fourth diode is an N-channel field effect transistor having a gate electrode, a back-gate electrode, and first and second current carrying electrodes, wherein the first current carrying electrode of the fourth diode is coupled to the first current carrying electrode of the third diode, and the second current carrying electrode, the gate electrode and the back-gate electrode of the fourth diode are commonly coupled.

15. The output driver of claim 14, wherein the back-gate electrode of the first diode is commonly coupled to second current carrying electrode and to the gate electrode of the first diode, and wherein the back-gate electrode of the third diode is commonly coupled to second current carrying electrode and to the gate electrode of the third diode.

16. The output driver of claim 14, wherein the back-gate electrode of the first diode, the gate electrode of the first diode, the back-gate electrode of the third diode, and the gate electrode of the third diode are coupled to a first bus.

17. The output driver of claim 13, wherein the second current carrying electrodes of the first diode, the second diode, the third diode, and the fourth diode are coupled a first bus and the first current carrying electrodes of the first diode, the second diode, the third diode, and the fourth diode are coupled a second bus.

* * * * *